(12) United States Patent
Bhattacharya et al.

(10) Patent No.: US 7,251,139 B2
(45) Date of Patent: Jul. 31, 2007

(54) THERMAL MANAGEMENT ARRANGEMENT FOR STANDARDIZED PERIPHERALS

(75) Inventors: Anandaroop Bhattacharya, Phoenix, AZ (US); Chia-pin Chiu, Tempe, AZ (US); Sridhar V. Machiroutu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 10/723,722

(22) Filed: Nov. 26, 2003

(65) Prior Publication Data

US 2005/0111185 A1 May 26, 2005

(51) Int. Cl.
 H05K 7/20 (2006.01)
 H05K 1/14 (2006.01)

(52) U.S. Cl. .................. 361/719; 361/692; 361/694; 361/720; 361/737; 165/80.3; 165/104.33

(58) Field of Classification Search ............ 361/690, 361/737, 691–695, 719–720; 165/80.3, 104.33; 174/16.1
See application file for complete search history.

(56) References Cited

U.S. PATENT DOCUMENTS

| | | | | | |
|---|---|---|---|---|---|
| 5,424,915 | A | * | 6/1995 | Katooka et al. | 361/695 |
| 5,861,703 | A | * | 1/1999 | Losinski | 310/330 |
| 5,862,037 | A | * | 1/1999 | Behl | 361/687 |
| 5,898,568 | A | * | 4/1999 | Cheng | 361/695 |
| 5,914,856 | A | * | 6/1999 | Morton et al. | 361/690 |
| 6,011,690 | A | * | 1/2000 | Hughes et al. | 361/704 |
| 6,031,718 | A | * | 2/2000 | Suzuki et al. | 361/695 |
| 6,034,871 | A | * | 3/2000 | Cheng | 361/695 |
| 6,052,284 | A | * | 4/2000 | Suga et al. | 361/699 |
| 6,123,145 | A | | 9/2000 | Glezer et al. | |
| 6,439,992 | B1 | * | 8/2002 | Demeter | 454/184 |
| 6,459,578 | B1 | * | 10/2002 | Wagner | 361/694 |
| 6,588,497 | B1 | * | 7/2003 | Glezer et al. | 165/84 |
| 6,631,077 | B2 | * | 10/2003 | Zuo | 361/699 |
| 6,650,542 | B1 | | 11/2003 | Chrysler et al. | |
| 6,801,430 | B1 | * | 10/2004 | Pokharna | 361/695 |
| 7,023,697 | B2 | * | 4/2006 | Pokharna et al. | 361/695 |
| 7,046,515 | B1 | * | 5/2006 | Wyatt et al. | 361/697 |
| 2002/0145851 | A1 | * | 10/2002 | Manno et al. | 361/687 |

FOREIGN PATENT DOCUMENTS

| | | | |
|---|---|---|---|
| JP | 10049258 A | * | 2/1998 |
| JP | 10-334204 | * | 12/1998 |
| JP | 2000-082890 | * | 3/2000 |

(Continued)

OTHER PUBLICATIONS

Kan et al., Air Cooling ig High-Power Modules with Low Profile Piezoelectric Fans, IBM Technical Disclosure Bulletin, vol. 37, No. 02B, Feb. 1994, pp. 149-150.*

(Continued)

*Primary Examiner*—Michael Datskovsky
*Assistant Examiner*—Robert J. Hoffberg
(74) *Attorney, Agent, or Firm*—Schwabe, Williamson & Wyatt, P.C.

(57) ABSTRACT

Embodiments of the present invention include an apparatus, method and system for a thermal management arrangement in a standardized peripheral device.

19 Claims, 6 Drawing Sheets

FOREIGN PATENT DOCUMENTS

JP          2000099209 A  *  4/2000

OTHER PUBLICATIONS

Davis et al., "Mixing Control of Fuel Jets Using Synthetic Jet Technology," AIAA 37th Aerosp. Sci. Meet. 99-0447, 1999, Reno, Nev.

Glezer et al., "Synthetic Jets," Annu. Rev. Fluid Mech., 2002, 34, pp. 503-529.

Mahalingam et al., "An Actively Cooled Heat Sink Integrated with Synthetic Jets," Proceedings of 35th National Heat Transfer Conference, Jun. 10-12, 2001, Anaheim, CA.

Rumigny et al., "Flow and Heat Transfer Characteristics of an Active Heat Sink Powered by Synthetic Jets," Bulletin of the American Physical Society-Division of Fluid Dynamics, 2001, vol. 46, No. 10, pp. 203.

"PC Card Primer," Personal Computer Memory Card International Association, http://www.pcmcia.org/pccard.htm, 29 pgs.

* cited by examiner

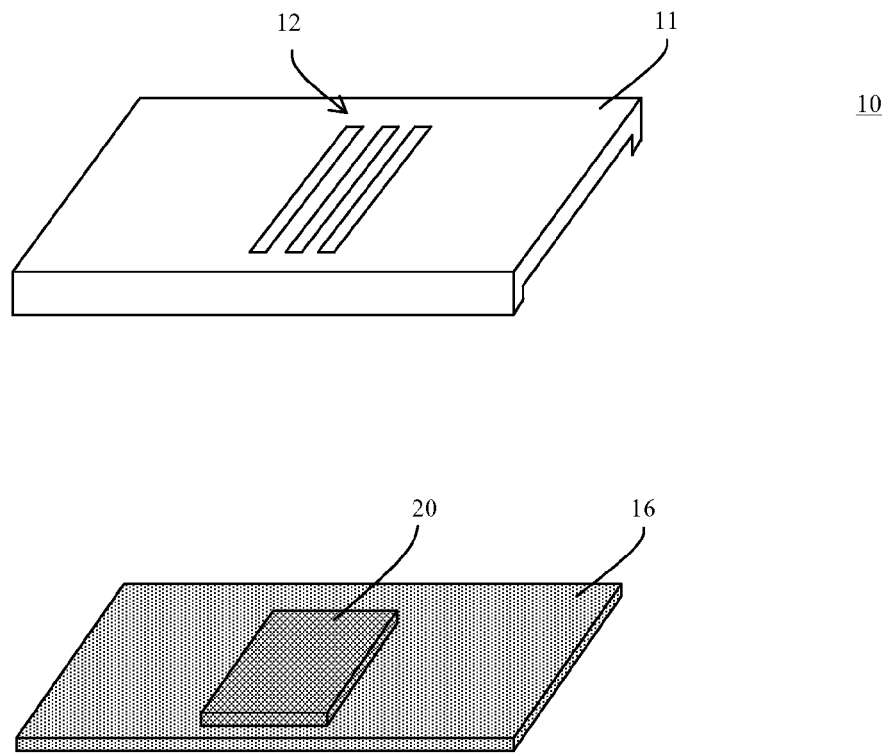
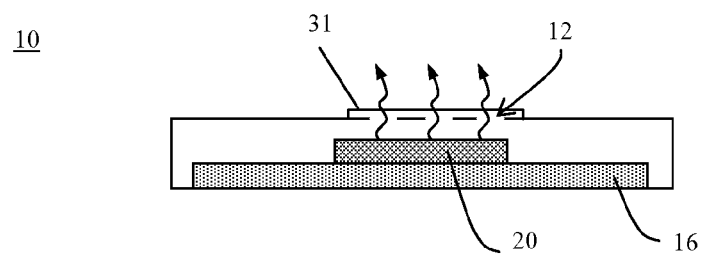
FIG. 1
FIG. 2

THERMAL MANAGEMENT ARRANGEMENT FOR STANDARDIZED PERIPHERALS

FIELD OF THE INVENTION

Disclosed embodiments of the invention relate to the field of integrated circuits, and more specifically to thermal management in standardized peripheral devices.

BRIEF DESCRIPTION OF THE DRAWINGS

Embodiments of the present invention are illustrated by way of example and not by way of limitation in the figures of the accompanying drawings, in which the like references indicate similar elements and in which:

FIG. 1 illustrates an exploded view of a standardized peripheral device with a thermal management arrangement including a vent, in accordance with one embodiment of this invention;

FIG. 2 illustrates a cross-sectional view of a standardized peripheral device with a simplified pictorial representation of heat transfer out of a vent, in accordance with one embodiment of this invention;

FIG. 7 (b) illustrates a cross-sectional view of a standardized peripheral device with a simplified pictorial representation of an air flow path through the interior of the device, in accordance with an embodiment of the present invention;

DETAILED DESCRIPTION OF EMBODIMENTS OF THE INVENTION

Figure 3:
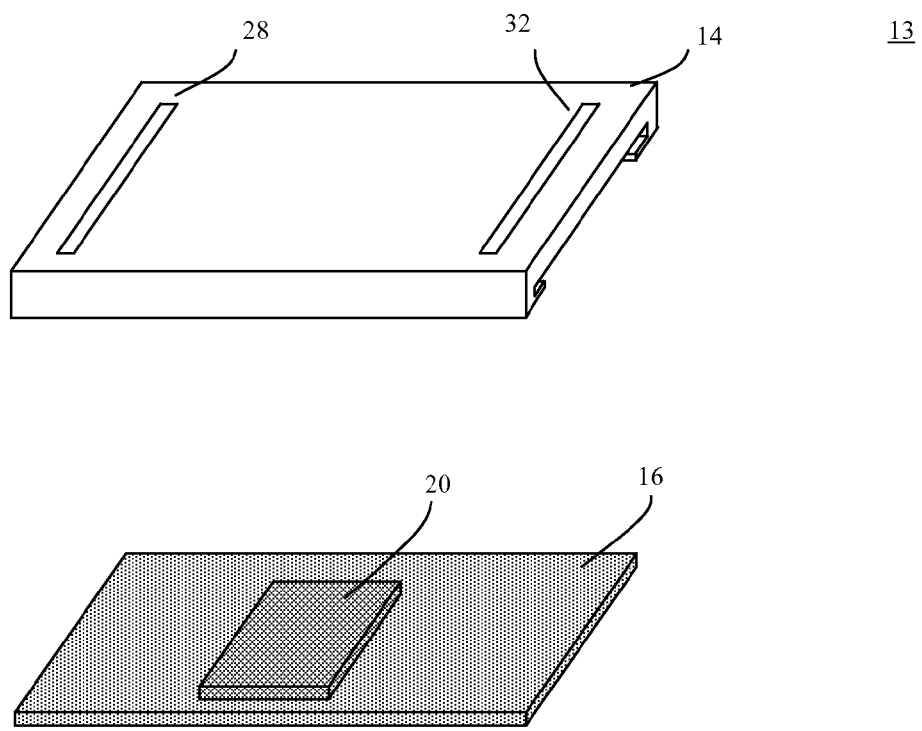
FIG. 3 illustrates an exploded view of a standardized peripheral device with a thermal management arrangement including an inlet vent and an outlet vent, in accordance with one embodiment of this invention.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions such as up, down, back, and front may be used in the discussion of the drawings. These directions are used to facilitate the discussion of the drawings and are not intended to restrict the application of the embodiments of this invention. Therefore, the following detailed description is not to be taken in a limiting sense, and the scope of the embodiments of the present invention are defined by the appended claims and their equivalents.

FIG. 1 illustrates an exploded view of a standardized peripheral device 10 with a thermal management arrangement in accordance with an embodiment of the present invention. An external case 11 may house internal electronic circuitry such as a board 16 and an integrated circuit 20.

In one embodiment, the case 11 may have a form factor and a number of external dimensions that are in compliance with a standard having a number of specifications governing the form factor and the external dimensions, but not providing for thermal management arrangements. Additionally, the standardized peripheral device 10 may include a thermal management arrangement that modifies and/or augments the case 11 to provide a suitable thermal environment for the integrated circuit 20, without causing the case 11 to cease to comply with either the form factor or external dimension specifications of the standard. For the embodiment of FIG. 1, the thermal management arrangement includes vents 12 disposed at a portion of the top surface of the case 11 to assist in heat transfer from the integrated circuit 20 to the ambient outside of the case.

The standardized peripheral device 10 could be any one of a number of standardized removable input/output devices of the type used with host devices such as desktop and portable personal computers, peripherals, and the like. The standardized peripheral device 10 may include a standardized connector (not shown) to directly couple the peripheral device 10 to the host device. In one embodiment, the connector may be of a type that holds the peripheral device 10 and the host device in a rigid relationship with one another. The connector may include, e.g. a 16-bit connector, a 32-bit Cardbus connector, or a universal serial bus (USB) connector.

In one embodiment the standardized peripheral device 10 may be of a type which conforms to standards established by the Personal Computer Memory Card International Association (PCMCIA), e.g., PC Card Standard 8.0 Release April 2001. Cards conforming to these standards may also be referred to as "PC Cards." These PC Cards may come in three form factors called type I, type II, and type III. While all of these cards may measure the same length and width, they may vary in thickness. The type I card may have a thickness of 3.3 mm; the type II card, 5 mm; and the type III card, 10.5 mm. Each PC Card type may be used for various purposes. For example: type I cards may be used for memory devices; type II may be used for communication devices such as modems, network adapters, small computer system interface (SCSI) adapters, etc.; and type III cards may be used to house rotating mass storage devices (disk drives). Embodiments of this invention may apply to type I, II, and III PC Cards as well as other standardized peripheral devices, e.g., a universal serial bus (USB) flash memory drive.

The integrated circuit 20 may be of any type that may be used in standardized peripheral devices. The integrated circuit 20 may be constructed in a small piece of semiconductor material referred to as a chip or die. Examples of the semiconductor material that may be used include, but are not limited to silicon, silicon on sapphire, silicon germanium, and gallium arsenide. The terms chip, die, integrated circuit, semiconductor device, monolithic device, and microelectric device are often used interchangeably in this field. Embodiments of the present invention may be applicable to all the above as they are generally understood in the field.

In one embodiment the board 16 may be an interconnecting substrate that integrates components such as chips, high-power resistors, mechanical switches, power sources, capacitors, etc. The board 16 may include ceramic (thick-filmed, cofired, or thin-filmed), plastic, and glass substrate materials.

FIG. 2 illustrates a cross-sectional view of the standardized peripheral device 10 with a simplified pictorial representation of heat transfer out of the vents 12, in accordance with one embodiment of this invention. As heat is transferred from the integrated circuit 20 to the air in the immediate vicinity, the heated air may experience a buoyant force creating an upward fluid motion. Heat transfer of this type may be referred to as natural convection.

In present standardized peripheral devices, natural convection may be constrained by an enclosed case, which may require conductive transfer through the case before convective heat transfer from the case to the ambient. This intermediate conductive heat transfer may introduce higher thermal resistances, which could potentially decrease the total amount of heat transfer. This form of heat transfer may not adequately accommodate the present trend of miniaturization and increasing power density of the chips used in standardized peripheral devices.

The present embodiment may decrease the total thermal resistance by providing one or more outlet vents 12 disposed on a portion of a surface of the case 11, which could increase the potential for more natural convection as opposed to conduction through the case walls. In one embodiment a screen 31 may be placed over the vents 12 to obstruct contaminants from entering the interior portions of the case 11.

FIG. 3 illustrates an exploded view of a standardized peripheral device 13 with a thermal management arrangement including an inlet vent 28 and an outlet vent 32, disposed in the same or different surfaces of the case 14, in accordance with one embodiment of this invention. This embodiment may take advantage of external air currents to facilitate the heat transfer away from the integrated circuit 20. In one embodiment a portion of the standardized peripheral device 13 may be place entirely within an interior cavity of a host device. The host device may have another thermal management arrangement that results in air currents inside the interior cavity of the host device. In this embodiment the case 14 may be designed to take advantage of such an air current. Air from the ambient, which in this embodiment is the interior cavity of the host device, may be directed into the interior of the standardized peripheral device 13 by an inlet vent 28. In one embodiment the inlet vent 28 may be designed with an upward flange 33 (shown below in FIG. 4) to facilitate the intake of a laminar flow over the case 14.

Figure 4:
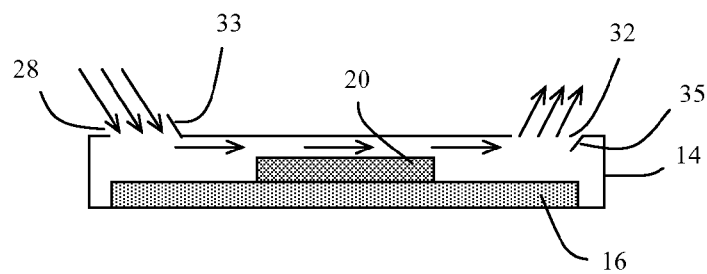
FIG. 4 illustrates a cross-sectional view of a standardized peripheral device with a simplified pictorial representation of an air flow path through the interior of the device, in accordance with an embodiment of the present invention.

FIG. 4 illustrates a cross-sectional view of the standardized peripheral device 13 with a simplified pictorial representation of an air flow path through the interior of the device, in accordance with one embodiment of the present invention. The air flow may travel over the integrated circuit 20, which may result in an overall increase in the heat transfer coefficient. As a result at least a portion of the thermal energy emitted from the integrated circuit 20 may be dissipated into and carried away by the current. Some of the heated air flow may then exit through the outlet vent 32 and thereby discharge a portion of the excess thermal energy back into the ambient. In one embodiment the outlet vent 32 may include a downward flange 35 to facilitate the exhaust of a laminar flow of heated air from the standardized peripheral device 13 into the ambient.

Figure 5:
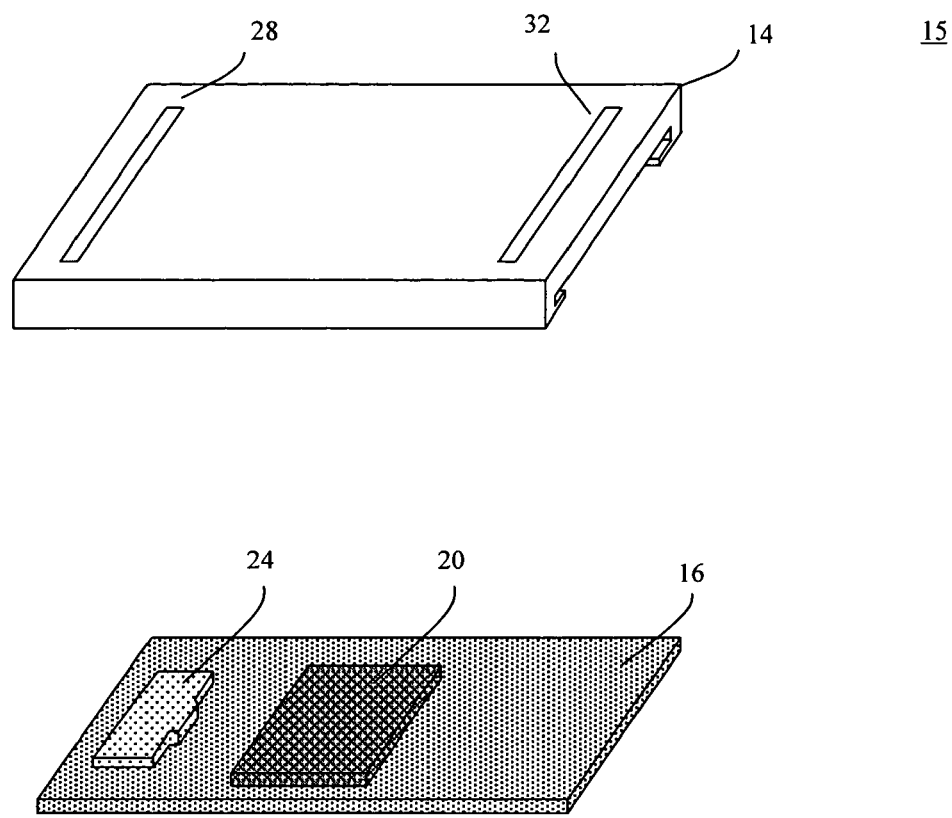
FIG. 5 illustrates an exploded view of a standardized peripheral device with a thermal management arrangement including an inlet vent, an outlet vent, and a flow generating device, in accordance with an embodiment of the present invention.

FIG. 5 illustrates an exploded view of a standardized peripheral device 15 with a thermal management arrangement including an inlet vent 28, an outlet vent 32, and a flow generating device 24, in accordance with an embodiment of this invention. In this embodiment, the flow generating device 24 may be used to at least facilitate the air flow over at least a portion of the integrated circuit 20. This may allow for forced convection heat transfer of at least a portion of the thermal energy generated by the integrated circuit 20. In one embodiment, the flow generating device 24 may have a low form factor and low power requirements. A low form factor flow generating device may be compatible with the low profile of the standardized peripheral device 10, and consume no more than the available board space (e.g., from the reduction of size of integrated circuit heat source due to improvement in the scale of integration). This may allow for forced convection through an assembly that heretofore has been relying on the conductive heat transfer through the case 14. As discussed earlier, conductive heat transfer may involve high thermal resistances that could potentially lower the amount of excess heat that can be dissipated into the surrounding ambient.

In one embodiment, the flow generating device 24 may be a jet actuator. Examples of a jet actuator include, but are not limited to, a pulsed and a continuous (conventional) jet actuator. One example of a pulsed jet actuator that may be used in an embodiment of the present invention is a synthetic jet actuator.

Figure 6:
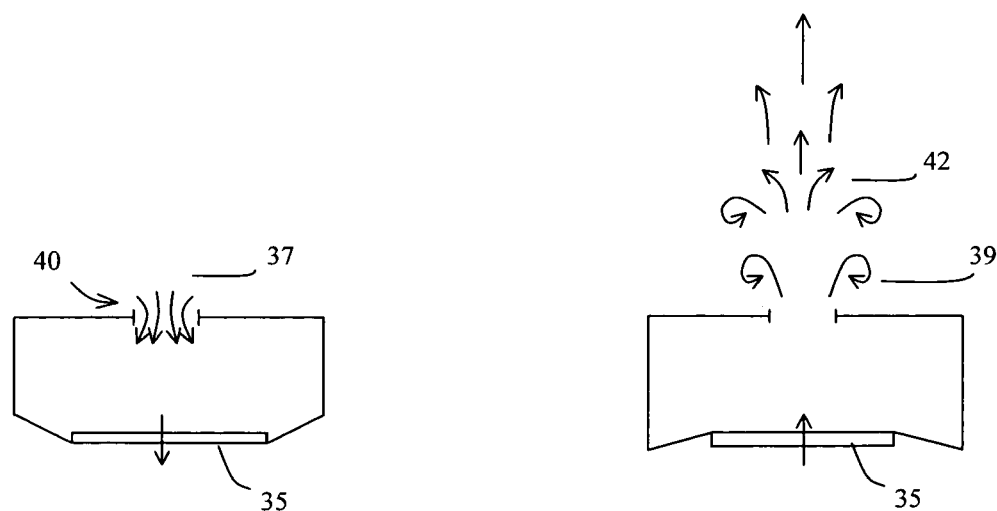
FIG. 6 illustrates a diagram representing the fluid flow created by a synthetic jet actuator, in accordance with an embodiment of this invention.

Referring to FIG. 6, there is shown a diagram representing the fluid flow created by a synthetic jet actuator, in accordance with an embodiment of the present invention. A synthetic jet actuator may be a small piezoelectric or electromagnetic device that is capable of creating a jet flow by vibration of a diaphragm 35. In one embodiment, the diaphragm 35 may include a piezoelectric polymer film that may convert voltages to mechanical movement. In another embodiment, a synthetic jet of an electromagnetic type may rely on a magnetic field around the diaphragm to provide mechanical movement.

These synthetic jets may be referred to as zero net mass flux jets because they add no mass to the system as they are comprised entirely of the working fluid (air in this embodiment) in which they are employed. That is, synthetic jets may add linear momentum to a flow without a net mass injection across a flow boundary. As the diaphragm 35 vibrates air is alternatively sucked in 37 and forced out 39 of an orifice 40. The orifice 40 in one embodiment may be rectangular. The frequency and amplitude of the vibrating diaphragm 35 may be adjusted for a particular embodiment.

The flow of the air may result from a train of axissymmetric vortices 42 travelling with a self-induced velocity. Additionally, there may be some turbulence due to eddy currents in a terminal boundary. However, the far field properties at relatively low Reynolds numbers may resemble more conventional, continuous jets. Therefore, the application of the synthetic jet flow in embodiments of the present invention may be thought of as being substantially laminar over the integrated circuit 20.

In one embodiment the synthetic jet actuators may have an overall diameter of approximately 30 mm and above and may have heights between 2-4 mm. In one embodiment, a synthetic jet of the given dimensions may be capable of producing flow rates of the order of 0.3 cubic feet per minute (CFM) of air at subaudible frequencies (less than 150 Hz) and at very low input powers (10-100 mW).

Although this embodiment discusses a synthetic jet actuator, the flow generating device 24 may be of any type that may develop sufficient flow rates and that may be deployed in the form factor and power constraints applicable in the standardized peripheral device of a given embodiment.

Figure 7:
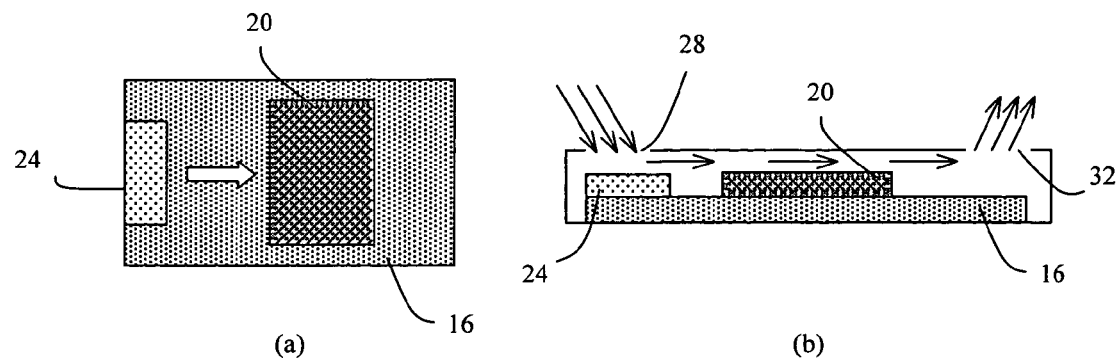
FIG. 7 (a) illustrates a top view of a board of a standardized peripheral device with a simplified pictorial representation of an air flow path depicted, in accordance with one embodiment of this invention.

FIGS. 7 (a) and (b) illustrate a simplified pictorial representation of an air flow path through the interior of the standardized peripheral device 15, in accordance with an embodiment of the present invention. In this embodiment the flow generating device 24 and the integrated circuit 20 may be coupled to the board 16. The air flow path in this embodiment may resemble the air flow path in the embodiment depicted in FIG. 4. However, in this embodiment the flow generating device 24 may facilitate the air flow across the integrated circuit 20. This may in turn, create a low pressure within the case that may facilitate the intake of air through the inlet vent 28 from the ambient. In various embodiments of the present invention, the flow generating device 24 may create a flow or simply supplement a preexisting flow from a current such as the one discussed with reference to FIGS. 3 and 4.

Figure 8:
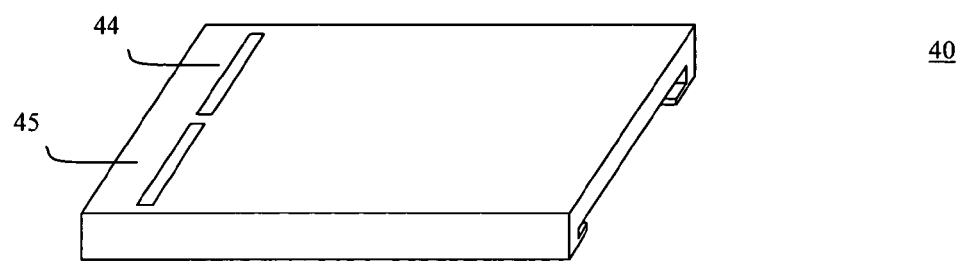
FIG. 8 illustrates an exploded view of a standardized peripheral device including a thermal management arrangement with a partition creating dual air flow chambers and a case including an inlet vent and an outlet vent, in accordance with an embodiment of the present invention.
Figure 8:
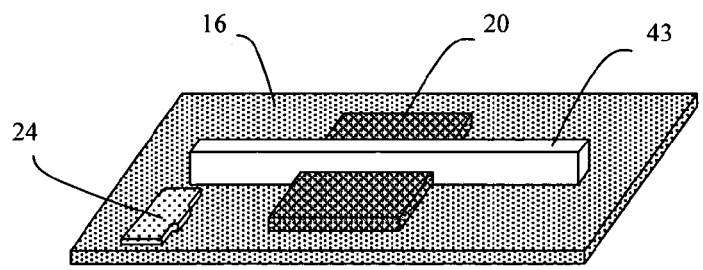

FIG. 8 illustrates an exploded view of a standardized peripheral device 40 including a thermal management arrangement with a partition 43 creating dual air flow chambers, a flow generating device 24, an outlet vent 44, and an inlet vent 45, in accordance with an embodiment of the present invention. In this embodiment the flow generating device 24, the integrated circuit 20, and the board 16 may be substantially similar to the components depicted and discussed with reference to the above embodiments. However, the present embodiment includes a partition 43 that may create dual air flow chambers in the interior of the standardized peripheral device 40.

Figure 9:
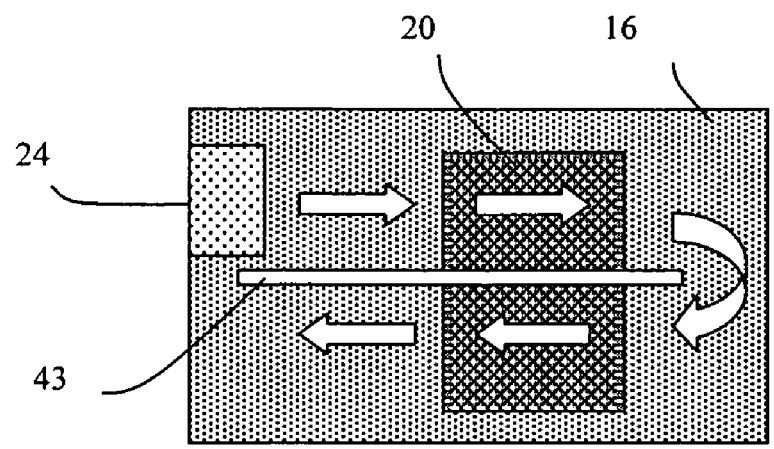
FIG. 9 illustrates a top view of a board of a standardized peripheral device with an air flow path depicted, in accordance with one embodiment of the present invention.

FIG. 9 illustrates a top view of the board 16 of the standardized peripheral device 40 with an air flow path depicted in accordance with an embodiment of the present invention. In this embodiment the flow generating device 24 may be place on one end of the first air flow chamber near the inlet vent 45. The flow generating device 24 may assist the air to travel the length of the first chamber passing over a portion of the integrated circuit 20. At the end of the first chamber the air flow may be forced into the second chamber, which is flow coupled with the first chamber, where it may pass over another portion of the integrated circuit 20. At the end of the second chamber, some of the air flow may exit through the outlet vent 44, thereby potentially dumping some of the excess thermal energy into the ambient. In one embodiment the inlet vent 45 and outlet vent 44 may be two areas of the same vent.

Figure 10:
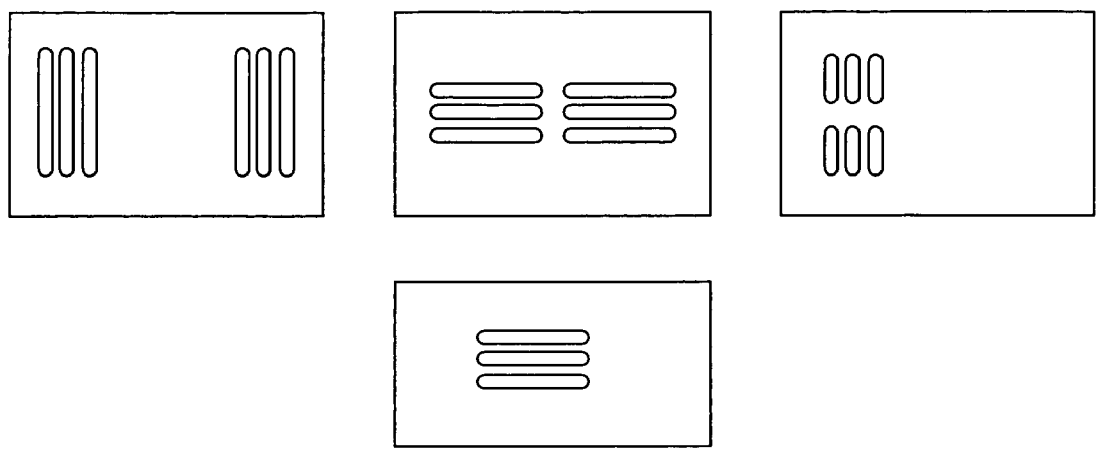
FIG. 10 illustrates alternative vent configurations that may be employed in accordance with embodiments of the present invention.

The number, position, and design of the vents may be adjusted to accommodate the particular factors of a given embodiment. Therefore, embodiments of the present invention are not restricted to the configurations described above. For example, referring to FIG. 10, there is shown a number of possible vent configurations that may be used in various embodiments of the present invention.

Figure 11:
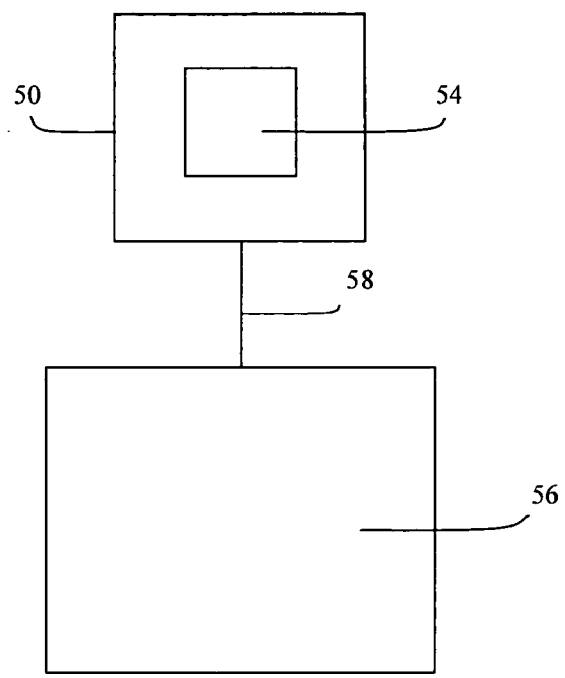
FIG. 11 depicts a system including a standardized peripheral device, in accordance with an embodiment of the present invention.

Referring to FIG. 11, there is illustrated one of many possible systems in which embodiments of the present invention may be used. The standardized peripheral device 50 may be similar to the standardized peripheral devices depicted in the above embodiments. The standardized peripheral device 50, which may include electronic circuitry 54 having an integrated circuit, may be connected to a host device 56 through a connector 58. Examples of the electronic circuitry may include, but are not limited to: memory (e.g., flash, read only memory (ROM), static random access memory (SRAM), and dynamic random access memory (DRAM)); communication (modem; network adapter; and small computer system interconnect (SCSI) adapter; and a disk drive. Examples of the host device 56 may include, but are not limited to a personal digital assistant (PDA), a palmtop PC, a notebook PC, a desktop computer, a digital audio recorder, a digital camera, a mobile phone, and a set-top box. Examples of the connector may include, but are not limited to a 16-bit PC Card interface, a 32-bit CardBus interface; and a USB interface.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A standardized peripheral apparatus comprising
   a board;
   an integrated circuit coupled to the board;
   a case, encasing the integrated circuit and the board, having a form factor including a plurality of external dimensions compatible with a Personal Computer Memory Card International Association (PCMCIA) standard having a plurality of specifications governing the form factor and the external dimensions;
   a thermal management arrangement including
   an outlet vent disposed on an end of a first portion of a top surface of the case to at least facilitate an exhaust of heat convectively emitted from the integrated circuit into an ambient, and
   a jet actuator coupled to the board to provide an air current to at least facilitate the exhaust of the convectively emitted heat through the outlet vent;
   an inlet vent disposed on the end of and second portion of the top surface of the case, to facilitate an intake of air from the ambient; and
   at least one partition disposed inside the case using available space to provide a pluratily of air flow chambers.

2. The standardized peripheral apparatus of claim 1, wherein the jet actuator is positioned substantially near the inlet vent.

3. The standardized peripheral apparatus of claim 1, wherein the jet actuator comprises a selected one of a piezoelectric synthetic jet actuator or an electromagnetic synthetic jet actuator.

4. The standardized peripheral apparatus of claim 1, wherein the jet actuator is approximately between 2-3 mm high.

5. The standardized peripheral apparatus of claim 1, wherein the jet actuator operates on input powers approximately between 10 and 50 milliwatts.

6. The standardized peripheral apparatus of claim 1, wherein the jet actuator and at least a portion of the integrated circuit are located substantially in a first air flow chamber.

7. The standardized peripheral apparatus of claim 6, wherein
the first air flow chamber is defined in part by the second portion of the top surface on which the inlet vent is disposed; and
the first portion of the top surface on which the outlet vent is disposed defines a second air chamber.

8. The standardized peripheral apparatus of claim 7, wherein the first air flow chamber is flow-coupled to the second air flow chamber.

9. The standardized peripheral apparatus of claim 1, wherein the apparatus is a selected one of a data storage device or a communication interface adapter.

10. The standardized peripheral apparatus of claim 1, wherein the air current is in convective communication with the integrated circuit.

11. The standardized peripheral apparatus of claim 1, wherein a partition of the at least one partition is connected orthogonally to the board.

12. The standardized peripheral apparatus of claim 1, further comprising:
a connector, to directly couple the standardized peripheral apparatus to a host device in a substantially rigid relationship.

13. The standardized peripheral apparatus of claim 12, wherein the connector comprises a selected one of a 32-bit Cardbus connector or a universal serial bus connector.

14. The standardized peripheral apparatus of claim 1, wherein the apparatus is a Type I, a Type II, or a Type III PC Card.

15. The standardized peripheral apparatus of claim 1, wherein the jet actuator assists the air to travel a length of a first air flow chamber passing over a portion of the integrated circuit, to enter a second air flow chamber at the end of the first air flow chamber, to travel a length of the second air flow chamber passing over another portion of the integrated circuit, and to exit through the outlet vent.

16. The standardized peripheral apparatus of claim 1, wherein the inlet vent is designed with an upward flange.

17. The standardized peripheral apparatus of claim 1, wherein the outlet vent is designed with a downward flange.

18. The standardized peripheral apparatus of claim 1, further comprising:
a screen placed over the outlet vent.

19. The standardized peripheral apparatus of claim 1, wherein the inlet vent and the outlet vent are rectangular in shape.

* * * * *

UNITED STATES PATENT AND TRADEMARK OFFICE
CERTIFICATE OF CORRECTION

| | |
|---|---|
| PATENT NO. | : 7,251,139 B2 |
| APPLICATION NO. | : 10/723722 |
| DATED | : July 31, 2007 |
| INVENTOR(S) | : Bhattacharya et al. |

Page 1 of 1

It is certified that error appears in the above-identified patent and that said Letters Patent is hereby corrected as shown below:

Column 6

Line 56, "...a pluratily..." should read --...a plurality...--.

Signed and Sealed this

Sixteenth Day of September, 2008

JON W. DUDAS
*Director of the United States Patent and Trademark Office*